(12) United States Patent
Toyota et al.

(10) Patent No.: US 7,642,141 B2
(45) Date of Patent: Jan. 5, 2010

(54) MANUFACTURING METHOD FOR DISPLAY DEVICE

(75) Inventors: Yoshiaki Toyota, Hachioji (JP); Takeshi Sato, Kokubunji (JP)

(73) Assignee: Hitachi Displays, Ltd., Chiba (JP)

( * ) Notice: Subject to any disclaimer, the term of this patent is extended or adjusted under 35 U.S.C. 154(b) by 0 days.

(21) Appl. No.: 12/155,204

(22) Filed: May 30, 2008

(65) Prior Publication Data

US 2008/0299693 A1    Dec. 4, 2008

(30) Foreign Application Priority Data

May 31, 2007    (JP)    ............... 2007-144957

(51) Int. Cl.
*H01L 21/786*    (2006.01)
(52) U.S. Cl. ................. 438/154; 438/34; 257/E21.634; 257/E21.635; 257/E29.117; 257/E29.122; 257/E29.279; 257/59
(58) Field of Classification Search ............. 257/30, 257/48, 57–59, 72, 128, 149, 151, 157, 161, 257/283, E33.001–E33.077, E21.632–E21.643, 257/E29.116–E29.122, E29.284, E29.299, 257/E21.432, E21.619–E21.62, E33.053; 438/22–47, 34, 199–233, 149–151, 152–153, 438/154; 349/42–46, 47–48
See application file for complete search history.

(56) References Cited

U.S. PATENT DOCUMENTS

2006/0046335 A1*    3/2006    Sarma et al. ................. 438/30

FOREIGN PATENT DOCUMENTS

JP        2006-186397        3/2006
KR    2001055071 A    *    7/2001

* cited by examiner

*Primary Examiner*—Matthew C Landau
*Assistant Examiner*—Aaron Staniszewski
(74) *Attorney, Agent, or Firm*—Stites & Harbison, PLLC; Juan Carlos A. Marquez, Esq.

(57) ABSTRACT

A manufacturing method for a display device having a first conductive type thin film transistor and a second conductive type thin film transistor, comprising the steps of: in formation regions for a first conductive type thin film transistor and a second conductive type thin film transistor forming a semiconductor layer, a first insulating film covering the semiconductor layer and a gate electrode disposed on the first insulating film so as to intersect the semiconductor layer, on substrate having first conductive type impurity regions on both outer sides of a channel region of the semiconductor layer below the gate electrode forming a second insulating film, in the second insulating film and the first insulating film forming a contact hole for a drain electrode and a source electrode, in the formation region for the second conductive type thin film transistor forming electrodes and a second conductive type impurity region.

8 Claims, 11 Drawing Sheets

⟨NTFT⟩

⟨PTFT⟩

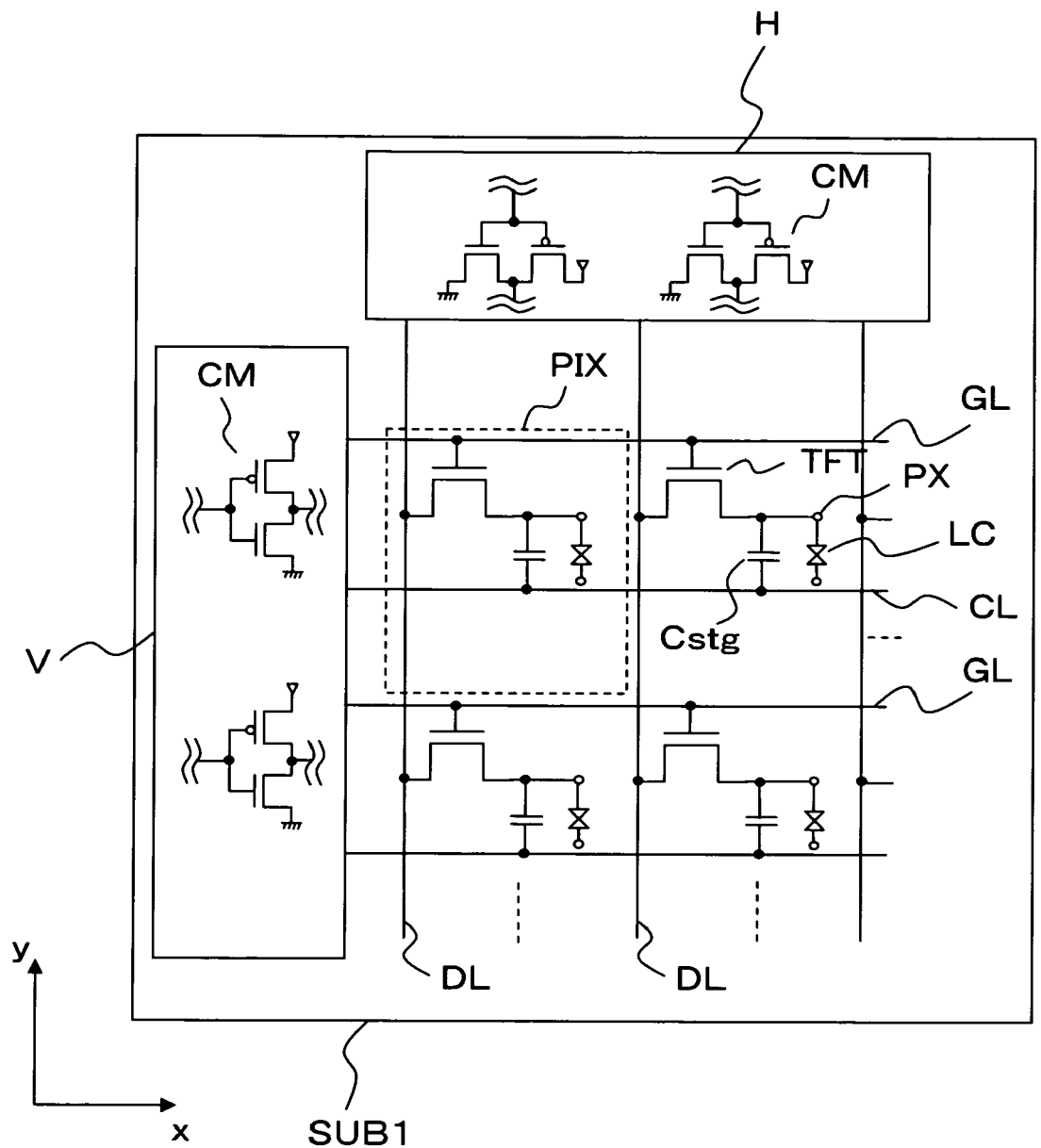

⟨NTFT⟩

⟨PX⟩

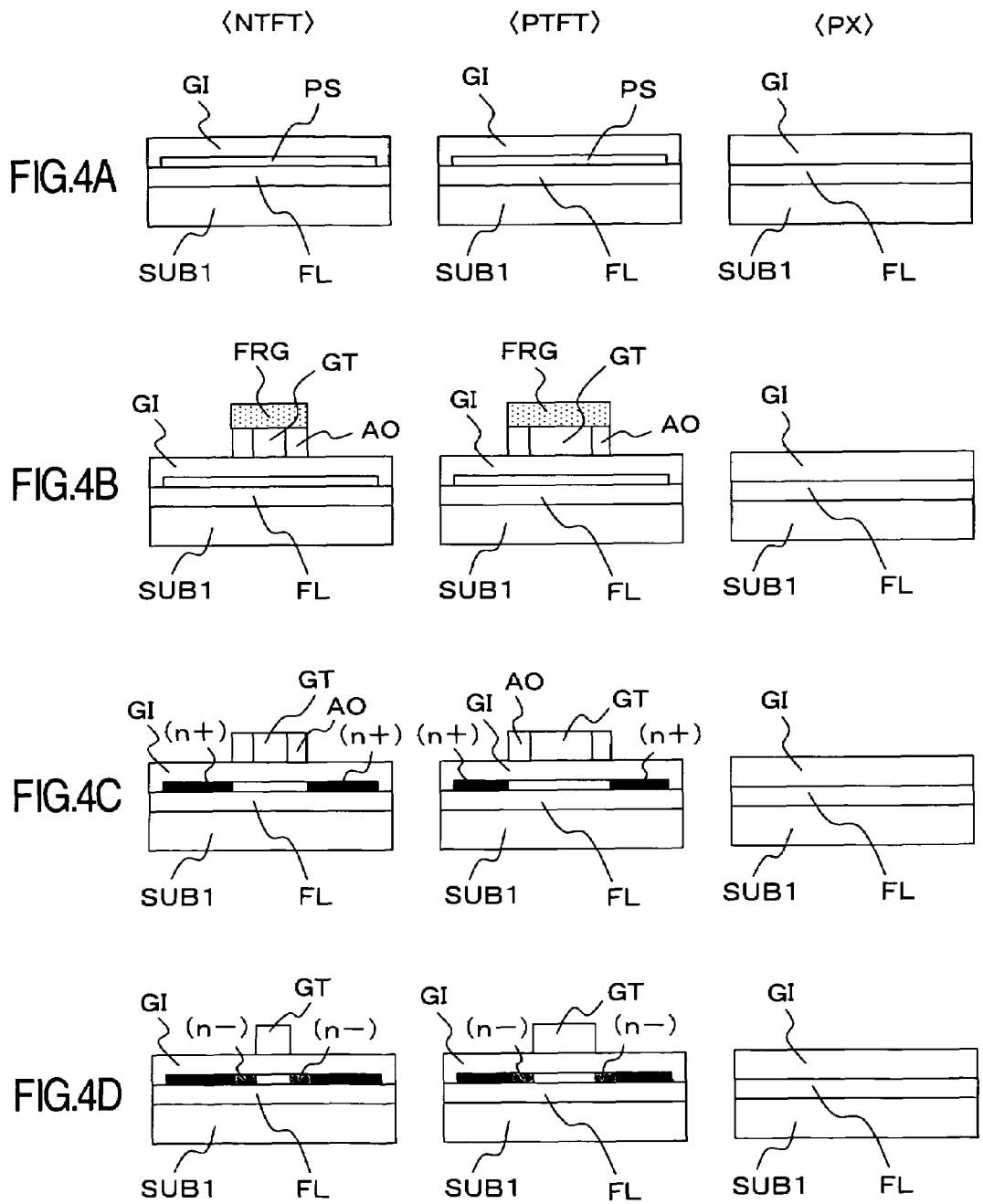

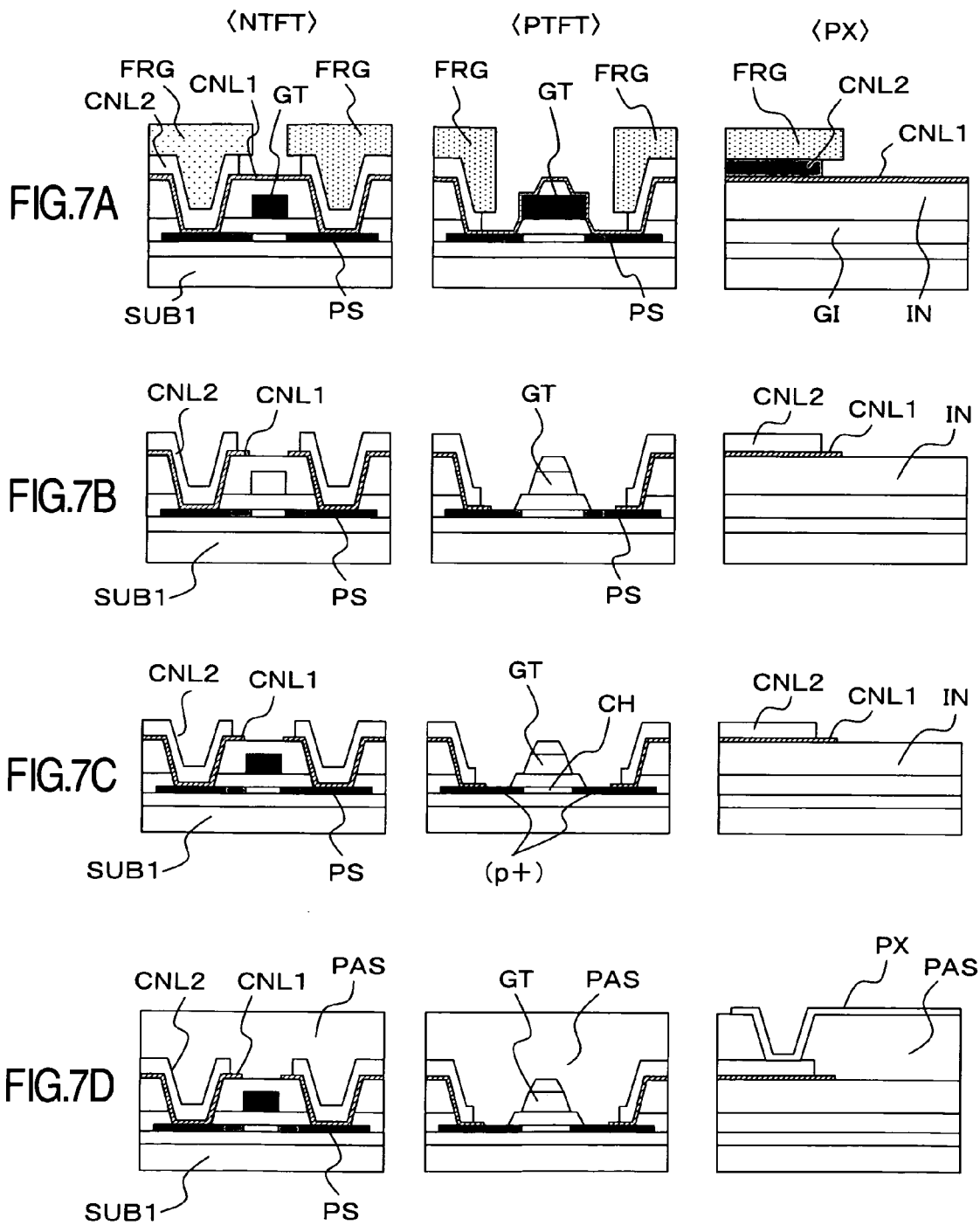

⟨NTFT⟩

⟨PX⟩

⟨NTFT⟩

⟨PTFT⟩

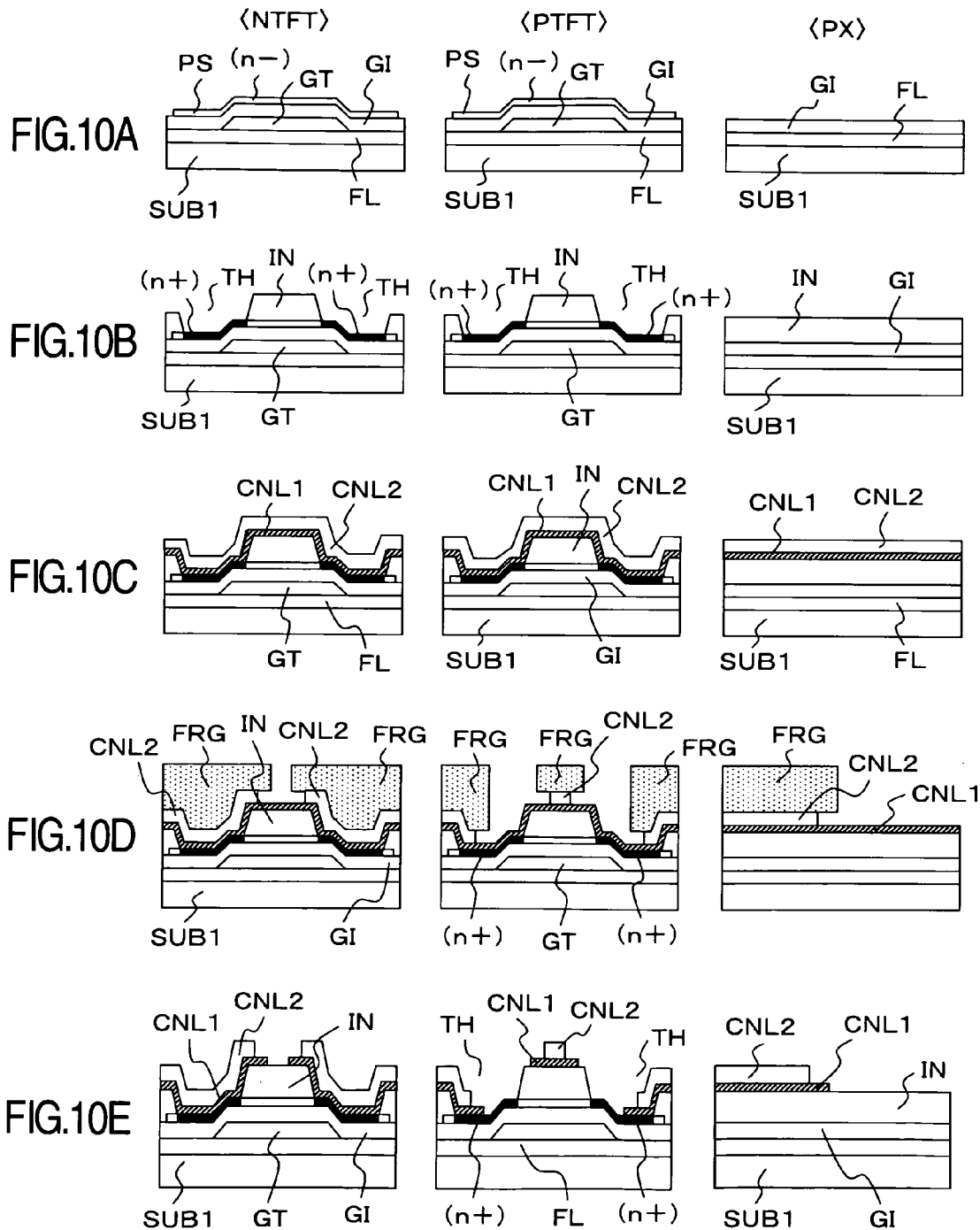

MANUFACTURING METHOD FOR DISPLAY DEVICE

INCORPORATION BY REFERENCE

The present application claims priority from Japanese application JP2007-144957 filed on May 31, 2007, the content of which is hereby incorporated by reference into this application.

BACKGROUND OF THE INVENTION

The present invention relates to a manufacturing method for a display device. More particularly, the present invention relates to a manufacturing method for a display device including a substrate having formed thereon an n-channel type thin film transistor and a p-channel type thin film transistor.

A so-called active matrix type display device has a structure in which a plurality of matrix-arranged pixels are provided on its display so as to sequentially select each pixel column by turning on a thin film transistor provided in each pixel of the pixel column by scanning signals supplied via a gate signal line and so as to supply video signals to each of the pixel electrodes PX via the drain signal line DL connected in common to the pixels of another pixel column corresponding to the respective pixels of the pixel column in conformity with this selection timing.

Further, on a substrate having formed thereon the display, a circuit (scanning signal drive circuit) that supplies scanning signals to each of the gate signal lines and a circuit (video signal drive circuit) that supplies video signals to each of the drain signal lines are formed in the vicinity of the display. Any of these circuits are constituted of a plurality of CMOS circuits. The CMOS circuit is a circuit formed by complementarily connecting an n-channel type transistor and a p-channel type transistor to each other.

In this case, there is known a circuit having a structure in which each transistor of each of the circuits formed in the vicinity of the display is formed by a pair of thin film transistors and is formed along with the formation of each of the pixels.

The display device having such a structure is disclosed, for example, in Japanese Unexamined Patent Application Publication No. 2006-186397.

SUMMARY OF THE INVENTION

However, when forming the CMOS transistor in a display device having the above-described structure, it is necessary to dope n-type impurities in a semiconductor layer of one thin film transistor to form source and drain regions and to dope p-type impurities in a semiconductor layer of the other thin film transistor to form source and drain regions.

In this case, there is adopted a method of forming source and drain regions in the semiconductor layer of one thin film transistor, then covering the one thin film transistor with a mask made of a photoresist film and doping impurities in the semiconductor layer of the other thin film transistor.

Therefore, it is inescapable that a photolithographic process for forming the mask is required and the number of man-hours for manufacture increases.

Accordingly, it is an object of the present invention to provide a manufacturing method for a display device in which the photolithographic process is reduced.

A summary of representative aspects of the invention disclosed in the present application will be described in brief as follows:

(1) A manufacturing method for a display device according to the present invention, for example, including a substrate having formed thereon a first conductive type thin film transistor and a second conductive type thin film transistor, the method comprising the steps of:

preparing a substrate having respective formation regions for a first conductive type thin film transistor and a second conductive type thin film transistor, in which a semiconductor layer, a first insulating film covering the semiconductor layer, and a gate electrode disposed on the first insulating film so as to intersect the semiconductor layer are formed and first conductive type impurity regions are formed on both outer sides of a channel region of the semiconductor layer below the gate electrode;

forming a second insulating film on the substrate so as to also cover the gate electrode, and forming in the second insulating film and the first insulating film a contact hole used for connection between a drain electrode and a source electrode, the contact hole being formed so as not to expose the gate electrode in the formation region for the first conductive type thin film transistor and so as to partially expose each side of the gate electrode intersecting the semiconductor layer in the formation region for the second conductive type thin film transistor;

forming the drain electrode and the source electrode using a multilayer conductive layer including an upper conductive layer and a lower conductive layer an outline of which protrudes outward from that of the upper conductive layer, the drain electrode and the source electrode being formed so as to cover each of the contact holes in the formation region for the first conductive type thin film transistor and so as to cover a portion of each of the contact holes facing the gate electrode in the formation region for the second conductive type thin film transistor; and forming by doping second conductive type impurities a second conductive type impurity region in the semiconductor layer having a portion having formed thereon none of the electrodes and having a portion having formed thereon only the lower conductive layer in each of the contact holes in the formation region for the second conductive type thin film transistor.

(2) The manufacturing method for a display device according to the present invention is, for example, on the premise of the constitution (1), characterized in that the semiconductor layer is made of polysilicon.

(3) The manufacturing method for a display device according to the present invention is, for example, on the premise of the constitution (1), characterized in that the first conductive type impurity regions formed on both outer sides of a channel region of the semiconductor layer below the gate electrode include low concentration first conductive type impurity regions formed on both outer sides of the channel region and high concentration first conductive type impurity regions formed on an outer side of the respective low concentration first conductive type impurity regions.

(4) The manufacturing method for a display device according to the present invention is, for example, on the premise of the constitution (1), characterized in that each of the drain electrode and the source electrode is formed by etching using as a mask a photoresist film formed on a surface of a layered product including the lower conductive layer and the upper conductive layer, and the upper conductive layer is etched larger than the lower conductive layer by side etching with respect to the mask.

(5) The manufacturing method for a display device according to the present invention is, for example, on the premise of the constitution (1), characterized in that the gate electrode and the lower conductive layer are made of the same material.

(6) The manufacturing method for a display device according to the present invention is, for example, on the premise of the constitution (5), characterized in that the gate electrode and the lower conductive layer are made of tungsten or a tungsten alloy.

(7) The manufacturing method for a display device according to the present invention is, for example, on the premise of the constitution (1), characterized in that a plurality of pixels are formed on the substrate, and each of the pixels has a thin film transistor turned-on by scanning signals from a gate signal line and a pixel electrode to which video signals from a drain signal line are supplied via the turned-on thin film transistor, the thin film transistor being one thin film transistor of the first conductive type thin film transistor and the second conductive type thin film transistor.

(8) The manufacturing method for a display device according to the present invention is, for example, on the premise of the constitution (7), characterized in that a scanning signal drive circuit that supplies scanning signals to each of the gate signal lines and a video signal drive circuit that supplies video signals to each of the drain signal lines are formed on the substrate; and the scanning signal drive circuit and the video signal drive circuit have the first conductive type thin film transistor and the second conductive type thin film transistor.

(9) A manufacturing method for a display device according to the present invention, for example, including a substrate having formed thereon a first conductive type thin film transistor and a second conductive type thin film transistor, the method comprising the steps of:

preparing a substrate having respective formation regions for a first conductive type thin film transistor and a second conductive type thin film transistor, in which a gate electrode, a first insulating film covering the gate electrode, and a semiconductor layer disposed on the first insulating film so as to intersect the gate electrode are formed;

forming a second insulating film on the substrate so as to also cover the semiconductor layer, and forming in the second insulating film a contact hole used for connection between a drain electrode and a source electrode;

forming a first conductive type impurity region in the semiconductor layer by doping a first conductive type impurity using the second insulating film as a mask;

forming a multilayer conductive layer including an upper conductive layer and a lower conductive layer an outline of which protrudes outward from that of the upper conductive layer, on the second insulating film above the gate electrode in the formation region for the second conductive type thin film transistor, and forming the drain electrode and the source electrode using the multilayer conductive layer so as to cover each of the contact holes in the formation region for the first conductive type thin film transistor and so as to cover a portion of each of the contact holes facing the gate electrode in the formation region for the second conductive type thin film transistor;

forming by doping a second conductive type impurity of high concentration a second conductive type impurity region in the semiconductor layer having a portion having formed thereon none of the electrodes and having a portion having formed thereon only the lower conductive layer in each of the contact holes in the formation region for the second conductive type thin film transistor; and forming in the semiconductor layer a channel region with second conductive type impurities by doping second conductive type impurities of low concentration through the drain electrode and the source electrode of the first conductive type thin film transistor.

(10) The manufacturing method for a display device according to the present invention is, for example, on the premise of the constitution (9), characterized in that the multilayer conductive layer formed on the second insulating film above the gate electrode in the formation region for the second conductive type thin film transistor is formed such that a side portion of the lower conducive layer intersecting the semiconductor layer is formed on an inner side of a corresponding sidewall surface of the second insulating film; and the second conductive type impurity of low concentration is doped to form respective second conductive type regions on both outer sides of the channel region of the semiconductor layer.

(11) The manufacturing method for a display device according to the present invention is, for example, on the premise of the constitution (9), characterized in that a plurality of pixels are formed on the substrate, and each of the pixels has a thin film transistor turned-on by scanning signals from a gate signal line and a pixel electrode to which video signals from a drain signal line are supplied via the turned-on thin film transistor, the thin film transistor being one thin film transistor of the first conductive type thin film transistor and the second conductive type thin film transistor.

(12) The manufacturing method for a display device according to the present invention is, for example, on the premise of the constitution (11), characterized in that a scanning signal drive circuit that supplies scanning signals to each of the gate signal lines and a video signal drive circuit that supplies video signals to each of the drain signal lines are formed on the substrate; and the scanning signal drive circuit and the video signal drive circuit have the first conductive type thin film transistor and the second conductive type thin film transistor.

Here, the present invention is not limited to the above-mentioned constitutions, and various modifications are conceivable without departing from the technical concept of the invention.

According to the manufacturing method for the thus constituted display device, the photolithographic process can be reduced.

BRIEF DESCRIPTION OF THE DRAWINGS

FIG. 2 is an equivalent circuit diagram showing the entire display device to which the manufacturing method for a display device according to the present invention is applied;

FIGS. 4A to 4D are step views showing one embodiment of the manufacturing method for a display device according to the present invention.

FIGS. 5A to 5C are step views showing one embodiment of the manufacturing method for a display device according to the present invention, and FIGS. 4A to 4D and 6A to 6D are views showing the whole steps;

FIGS. 6A to 6D are step views showing one embodiment of the manufacturing method for a display device according to the present invention, and FIGS. 4A to 4D and 5A to 5C are views showing the whole steps;

FIGS. 7A to 7D are step views showing another embodiment of a manufacturing method for a display device according to the present invention;

FIGS. 10A to 10E are step views showing another embodiment of the manufacturing method for a display device according to the present invention;

FIGS. 10A to 10E and FIGS. 11A to 11E are views showing the whole steps.

DETAILED DESCRIPTION OF THE INVENTION

Figure 1A:
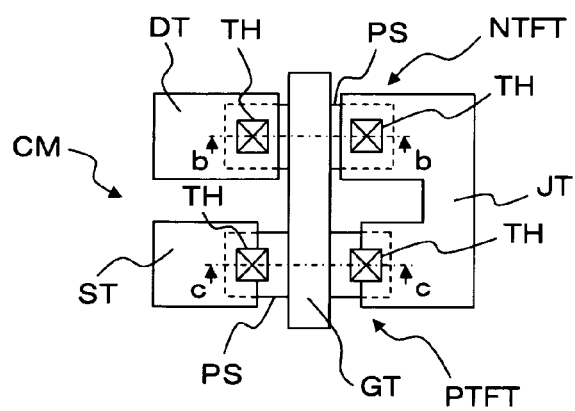
FIGS. 1A to 1C are block diagrams showing one embodiment of a CMOS transistor formed in a display device to which a manufacturing method for a display device according to the present invention is applied.

Preferred embodiments of a display device according to the present invention will be described below with reference to the figures.

First Embodiment

<Entire Equivalent Circuit>

FIG. 2 is an equivalent circuit diagram showing, as a liquid crystal display device, one embodiment of the display device according to the present invention.

In FIG. 2, a substrate SUB1 made of, for example, glass is shown. This substrate SUB1 is constituted as one substrate SUB1 of a pair of substrates disposed opposite each other through a liquid crystal interposed therebetween.

Further, gate signal lines GL which extend in the x direction and are juxtaposed in the y direction and drain signal lines DL which extend in the y direction and are juxtaposed in the x direction in FIG. 2 are formed on a liquid-crystal-side surface of the substrate SUB1.

Each of the gate signal lines GL is formed so that, for example, its one end is connected to a scanning signal drive circuit V and hence, scanning signals are sequentially supplied to the line GL by the scanning signal drive circuit V. This scanning signal drive circuit V is constituted of a large number of CMOS thin film transistors CM in which an n-channel type MOS transistor and a p-channel type MOS transistor are complementarily connected to each other.

Each of the drain signal lines DL is formed so that, for example, its upper end is connected to a video signal drive circuit H and hence, video signals are supplied to the line DL by the video signal drive circuit H. This video signal drive circuit H is constituted of a large number of CMOS thin film transistors CM in which an n-channel type MOS transistor and a p-channel type MOS transistor are complementarily connected to each other.

A rectangular area (e.g., indicated by a dotted frame in the figure) surrounded by adjacent ones of the gate signal lines and adjacent ones of the drain signal lines is formed as an area in which a pixel PIX is formed. The pixel PIX has a thin film transistor TFT turned on by scanning signals from the gate signal line GL, a pixel electrode PX to which video signals from the drain signal line DL are supplied via the turned-on thin film transistor TFT, and a capacitance element Cstg formed between the pixel electrode PX and a capacitance signal line CL disposed in parallel with, for example, the gate signal line GL.

Additionally, the pixel electrode PX is arranged so as to generate an electric field with a counter electrode (not shown) formed on a liquid-crystal-side surface of the substrate SUB1 or on a liquid-crystal-side surface of another substrate SUB2 different from the substrate SUB1 and so as to cause molecules in a liquid crystal LC of the pixel to behave by this electric field.

The liquid crystal display device having such a structure is driven so as to sequentially select each pixel column by turning on the thin film transistor TFT formed in each of the pixels by scanning signals supplied via the common gate signal line GL, and so as to supply video signals to each of the pixel electrodes PX via the drain signal line DL connected in common to the pixels of another pixel column corresponding to the respective pixels of the pixel column in conformity with this selection timing.

<Construction of Pixel>

Figure 3A:
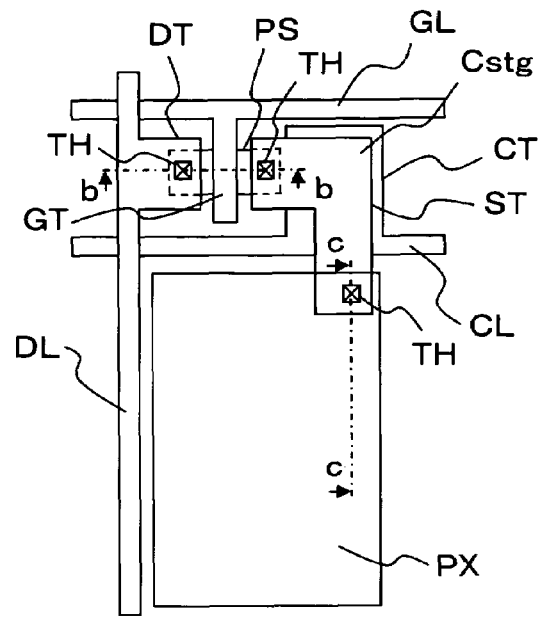
FIGS. 3A to 3C are block diagrams showing one embodiment of pixels of the display device to which the manufacturing method for a display device according to the present invention is applied.

FIG. 3A is a plan view showing one embodiment of a construction of the pixel, and shows a portion equivalent to an area surrounded by a dotted frame of FIG. 2.

Figure 3B:
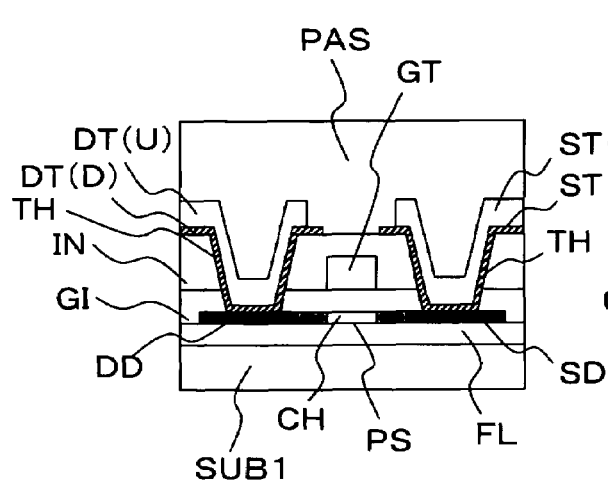
Figure 3C:
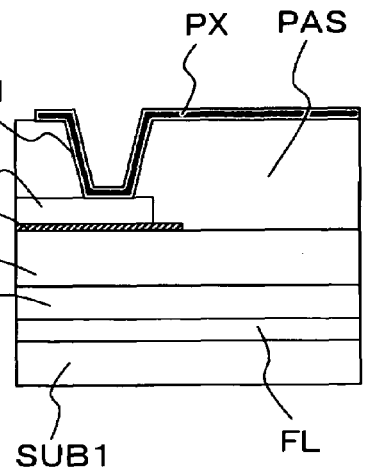

Further, FIG. 3B shows a cross-sectional view taken along line b-b of FIG. 3A, and FIG. 3C shows a cross-sectional view taken along line c-c of FIG. 3A.

Additionally, this pixel includes a so-called top gate type thin film transistor in which a gate electrode is formed on the upper layer of a semiconductor layer.

An undercoat layer FL made of, for example, a silicon dioxide film is formed on a liquid-crystal-side surface of the substrate SUB1. The undercoat layer FL serves as a layer for preventing impurities within the substrate SUB1 from penetrating an after-mentioned semiconductor layer PS. The capacitance signal line CL is formed on a surface of the undercoat layer FL, and formed in a pattern partially having an extended portion whose one side has a relatively wide area. The extended portion is formed as one electrode CT of the after-mentioned capacitance element Cstg.

Further, the semiconductor layer PS made of a polysilicon film is formed close to an electrode CT of the capacitance signal line CL.

This semiconductor layer PS is formed as a semiconductor layer of, for example, an after-mentioned n-channel type thin film transistor NTFT. In the semiconductor layer PS, low concentration n-type impurity regions are respectively formed on both outer sides of a channel region CH positioned roughly in its center, and high-concentration n-type impurity regions are respectively formed on an outer side of the low concentration n-type impurity regions. Each of the low concentration n-type impurity regions functions as an LDD region, and each of the high concentration n-type impurity regions functions as a drain region DD and a source region SD.

A source region and a drain region of the thin film transistor TFT changes in a state where a bias voltage is applied. In this specification, for convenience sake, a part connected to the after-mentioned drain signal line DL is designated as the drain region DD, and a part connected to the pixel electrode PX is designated as the source region SD.

On a surface of the substrate SUB1 on which the capacitance signal line CL and the semiconductor layer PS are thus formed, an insulating film (first insulating film) GI made of, for example, a silicon dioxide film is formed to also cover these capacitance signal line CL and semiconductor layer PS. This insulating film GI functions as a gate insulating film of the n-channel type thin film transistor NTFT.

Further, the gate signal line GL made of, for example, aluminum is formed on a surface of the insulating film GI. This gate signal line GL has an extended portion overlapping the channel region CH of the semiconductor layer PS and this extended portion functions as the gate electrode GT of the thin film transistor TFT.

On a surface of the substrate SUB1 on which the gate signal line GL is thus formed, an insulating film (second insulating film) IN made of, for example, silicon dioxide film is formed.

Further, the drain signal line DL is formed on the surface of the insulating film IN, and partially has an extended portion. The extended portion is formed as a drain electrode DT of the thin film transistor TFT. This drain electrode DT is connected to a drain region DD of the semiconductor layer PS via a contact hole TH formed through the insulating films IN and GI.

Further, a source electrode ST of the n-channel type thin film transistor NTFT is formed during the formation of the drain signal line DL. The source electrode ST is connected to a source region SD of the semiconductor layer PS via the contact hole TH formed through the insulating films IN and GI.

The source electrode ST is formed on the insulating film IN so as to overlap the electrode CT of the capacitance signal line CL as well as is formed to extend toward the central side of the pixel region. A portion of the source electrode ST overlapping the electrode CT is formed as the capacitance element Cstg using the insulating films IN and GI as a dielectric film. Further, a portion corresponding to an end of the extended portion of the source electrode ST serves as a connection portion to the after-mentioned pixel electrode PX.

Here, each of the drain signal line DL, the drain electrode DT and the source electrode ST has the two-layered structure in which, for example, a conductive layer made of tungsten having a thickness of about 30 nm and a conductive layer made of aluminum having a thickness of about 500 nm are sequentially stacked. Further, this two-layered structure has a structure in which a lower conductive layer protrudes outward from an upper conductive layer at the periphery.

Therefore, the drain electrode DT includes a lower drain electrode DT(D) and an upper drain electrode DT(U), and the lower drain electrode DT(D) is formed to protrude outward from the upper drain electrode DT(U).

In the same manner, the source electrode ST includes a lower source electrode ST(D) and an upper source electrode ST(U), and the lower source electrode ST(D) is formed to protrude outward from the upper source electrode ST(U).

Additionally, also in the extended end of the source electrode ST serving as the connection portion to the pixel electrode PX, the lower source electrode ST(D) is formed to protrude outward from the upper source electrode ST(U) as shown in FIG. 3C.

On the surface of the substrate SUB1 on which the drain signal line DL, the drain electrode DT, and the source electrode ST are thus formed, a protective coat PAS made of, for example, resin is formed. Further, on a surface of the protective coat PAS, the pixel electrode PX made of, for example, an ITO film is formed. This pixel electrode PX is connected to the source electrode ST via the contact hole TH formed in the protective coat PAS.

<CMOS Thin Film Transistor>

Figure 1B:
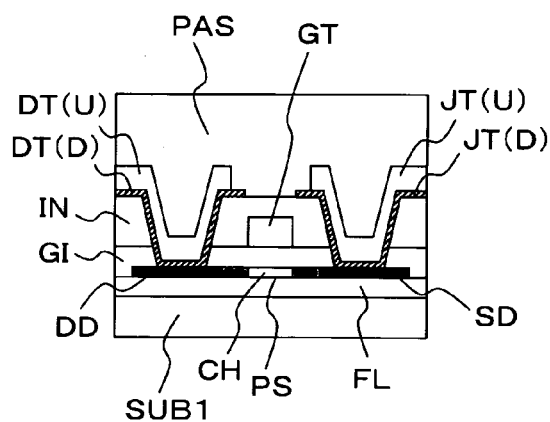
Figure 1C:
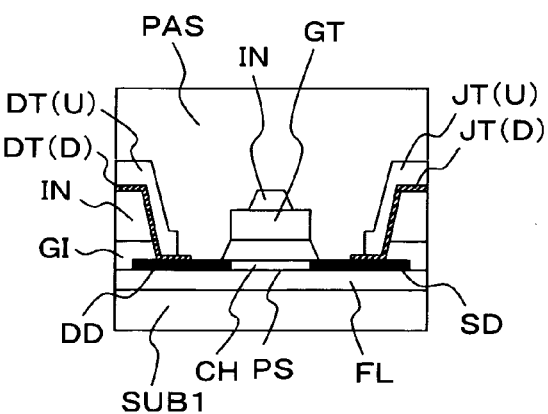

FIG. 1A is a plan view showing one of the CMOS thin film transistors CM formed by being incorporated into the scanning signal drive circuit V or the video signal drive circuit H. FIG. 1B shows a cross-sectional view taken along line b-b of FIG. 1A, and FIG. 1C shows a cross-sectional view taken along line c-c of FIG. 1A.

Additionally, this CMOS thin film transistor CM is formed along with the formation of the pixel PIX.

In the FIG. 1A, the CMOS thin film transistor CM has a structure in which the n-channel type thin film transistor NTFT and a p-channel type thin film transistor PTFT are arranged in parallel with each other, and the gate electrodes of both the transistors are formed in common.

Further, respective electrodes at the right sides in the figures of the n-channel type thin film transistor NTFT and the p-channel type thin film transistor PTFT are connected to each other via a connection electrode JT.

Thus, in this specification, for convenience' sake, the electrode at the right side in the figure of the n-channel type thin film transistor NTFT constitutes the drain electrode DT, and the electrode at the right side in the figure of the p-channel type thin film transistor PTFT constitutes the source electrode ST.

As shown in FIG. 1B, the n-channel type thin film transistor NTFT has the same structure as that of the n-channel type thin film transistor NTFT (refer to FIG. 3B) formed in the pixel PIX. Additionally, in FIG. 1B, the electrode connected to the source region SD of the semiconductor layer PS is named the connection electrode JT and therefore, the electrode is symbolized as JT(U) and JT(D).

Therefore, the structure of the p-channel type thin film transistor PTFT will be mainly described in FIGS. 1A to 1C.

First, the structure of the contact holes TH used for connection between respective electrodes equivalent to the source/drain electrodes differs from that of the n-channel type thin film transistor PTFT.

The contact hole TH is formed in the insulating films IN and GI after the semiconductor layer PS, the insulating film GI, the gate electrode GT, and the insulating film IN are formed on a surface of the undercoat layer FL of the substrate SUB1. Additionally, the contact hole TH is formed to expose each side of the gate electrode GT intersecting the semiconductor layer PS in the p-channel type thin film transistor PTFT.

In formation regions for the contact holes TH, each electrode formed in each of the contact holes TH is formed so as to cover about half of a region facing the gate electrode GT. Further, each of the electrodes has the two-layered structure in which a conductive layer made of tungsten having a thickness of about 30 nm and a conductive layer made of aluminum having a thickness of about 500 nm are sequentially stacked. This two-layered structure is a structure in which the lower conductive layer is formed to protrude outward from the upper conductive layer on the periphery of the structure.

Specifically, the drain electrode DT includes the lower drain electrode DT (D) and the upper drain electrode DT (U), and the lower drain electrode DT (D) is formed to protrude outward from the upper drain electrode DT (U). In the same manner, the connection electrode JT includes the lower connection electrode JT (D) and the upper connection electrode JT (U), and the lower connection electrode JT (D) is formed to protrude outward from the upper connection electrode JT (U).

In the semiconductor layer PS, the channel region CH is formed in a region immediately below the gate electrode GT. In the formation regions for the respective contact holes TH, the drain region DD and the source region SD in regions immediately below the upper drain electrode DT(U) and the upper connection electrode JT(U) are formed as high concentration n-type impurity regions.

Further, in the semiconductor layer PS, high concentration p-type impurity regions are formed between the channel region CH and each of the high concentration n-type impurity regions. The lower drain electrode DT(D) and the lower connection electrode JT(D) are in direct contact with and electrically connected to the high concentration p-type impurity regions, respectively.

<Manufacturing Method>

FIGS. 4A to 4D, 5A to 5C, and 6A to 6D are step views showing one embodiment of a manufacturing method of the liquid crystal display device.

In FIGS. 4A to 4D and 5A to 5C, cross-sectional views taken along line b-b of FIG. 1A (cross-sectional views taken along line b-b of FIG. 3A) are shown at the left side of the figure, cross-sectional views taken along line c-c of FIG. 1A are shown at the center of the figure, and cross-sectional views taken along line c-c of FIG. 3A are shown at the right side of the figure. That is, a portion of the n-channel type thin film transistor NTFT is shown at the left side of the figure, a portion of the p-channel type thin film transistor PTFT is shown at the center of the figure, and a portion of the pixel electrode PX is shown at the right side of the figure. Hereinafter, a description will be made in the order of steps.

First, as shown in FIG. 4A, the undercoat layer FL made of, for example, silicon dioxide film is formed to a thickness of about 300 nm on the liquid-crystal-side surface of the substrate SUB1 made of, for example, glass. Further, the semiconductor layer PS made of polysilicon is formed on a predetermined portion of a surface of this undercoat layer FL.

The formation of the semiconductor layer PS is as follows. That is, for example, an amorphous silicon layer is deposited to a thickness of about 50 nm by, for example, a plasma CVD method on the entire area of the undercoat layer FL. Subsequently, after crystallizing the amorphous silicon layer with irradiation of XeCl excimer laser, the semiconductor layer PS is formed into an island pattern by selective etching using photolithography techniques.

Further, on a surface of the substrate SUB1, the insulating film (first insulating film) GI is formed to also cover the semiconductor layer PS. The formation of the insulating film GI is performed by depositing a silicon dioxide film to a thickness of about 100 nm by, for example, the plasma CVD method.

Next, as shown in FIG. 4B, an aluminum film is formed on a surface of the insulating film GI, and the gate electrode GT (connected to the gate signal line GL) is formed by photo-etching steps. Further, a photoresist film FRG used during the formation of the gate electrode GT is left as it is, and the gate electrode GT is subjected to anodic oxidation, thereby forming an anodic oxide film AO on a sidewall surface of the electrode GT.

Next, as shown in FIG. 4C, the photoresist film FRG is removed and a high concentration of phosphorus ions are implanted using as a mask the gate electrode GT having formed thereon the anodic oxide film AO, whereby the high concentration n-type impurity region (shown as $n^+$ in the figure) is formed on the semiconductor layer PS.

Next, as shown in FIG. 4D, the anodic oxide film AO is removed from the gate electrode GT by etching and a low concentration of phosphorus ions are implanted using as a mask the gate electrode GT having removed therefrom the anodic oxide film AO, whereby the low concentration n-type impurity region (shown as $n^-$ in the figure) is formed on the semiconductor layer PS.

Figure 5A:
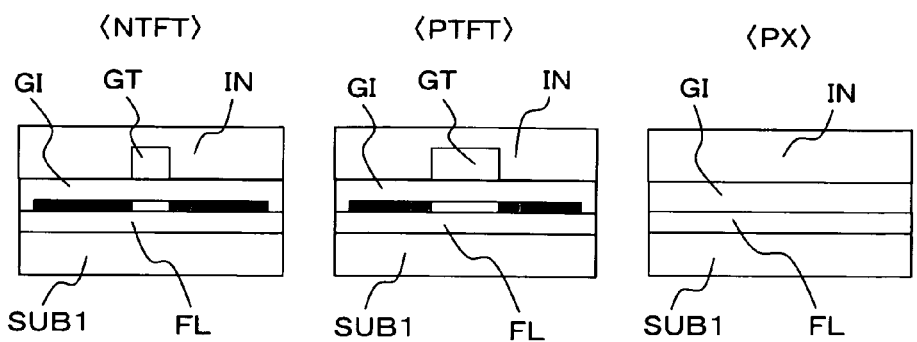
FIGS. 5A to 5C and 6A to 6D are views showing the whole steps.

Next, as shown in FIG. 5A, an insulating film (second insulating film) IN made of, for example, silicon nitride film is formed to also cover the gate electrode GT on a surface of the substrate SUB1. The insulating film IN functions as an interlayer insulating film for realizing electrical insulation between the after-mentioned drain signal line DL and the gate signal line GL.

Figure 5B:
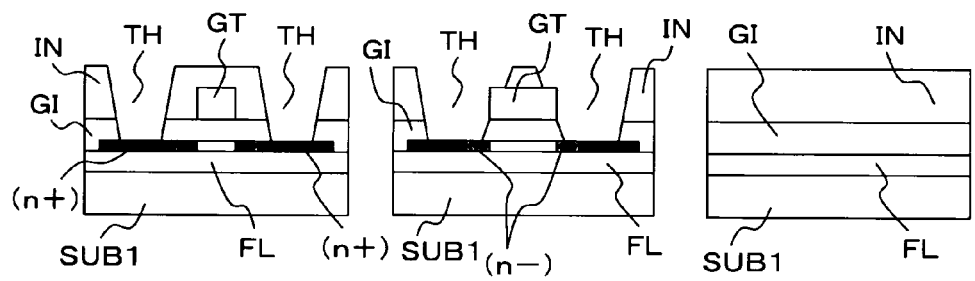

Further, as shown in FIG. 5B, the contact holes TH are formed in the insulating film IN. Thereby, a portion of each of the high concentration n-type impurity regions (shown as $n^+$ in the figure) is exposed in the semiconductor layer PS of the n-channel type thin film transistor NTFT, and a portion of each of the high concentration n-type impurity regions (shown as $n^+$ in the figure) is exposed in the semiconductor layer PS of the p-channel type thin film transistor PTFT.

In this case, the contact hole TH in the formation region for the p-channel type thin film transistor PTFT is formed to expose a portion of each side of the gate electrode GT of the p-channel type thin film transistor PTFT, the each side being intersecting the semiconductor layer PS. Additionally, the contact holes TH, each having a sidewall surface with a tapered shape, is normally formed. Therefore, without being limited to a portion of each of the high-concentration n-type impurity regions, a portion of each of the low concentration n-type impurity regions (shown as $n^-$ in the figure) that are formed to be located at each side of the channel region CH is also exposed in the semiconductor layer PS exposed by the contact holes TH.

Figure 5C:
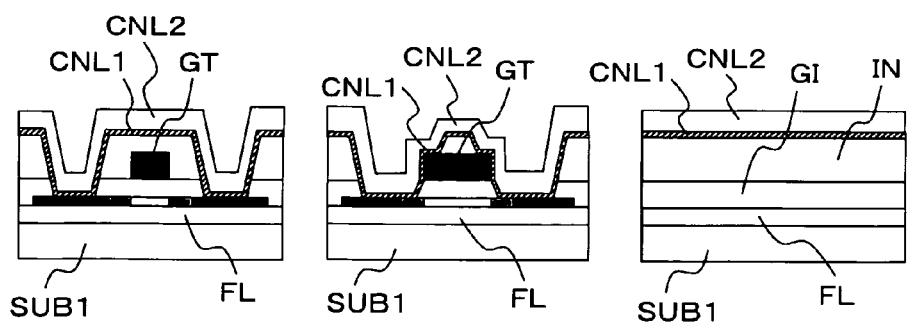

Next, as shown in FIG. 5C, on a surface of the substrate SUB1, a first conductive layer CNL1 made of tungsten having, for example, a thickness of 30 nm and a second conductive layer CNL2 made of aluminum having, for example, a thickness of 500 nm are sequentially formed to also cover the contact holes TH.

Figure 6A:
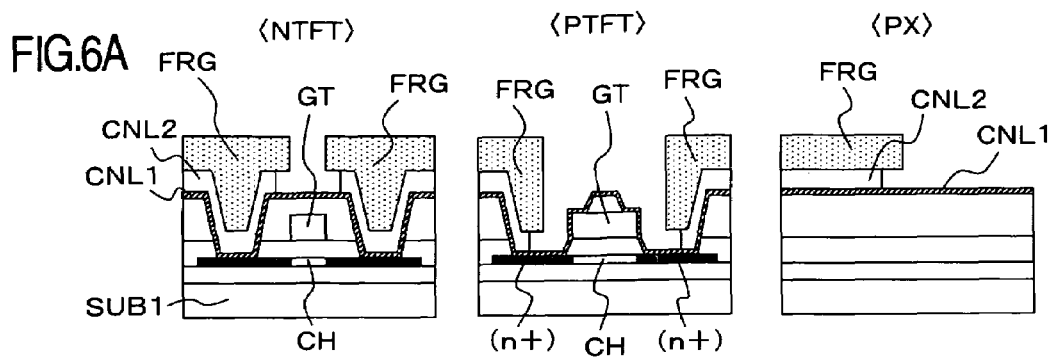

Next, as shown in FIG. 6A, on the entire region of a surface of the second conductive layer CNL2, the photoresist film FRG is formed and then patterned using photolithography techniques.

That is, in the formation region for the n-channel type thin film transistor NTFT, the photoresist film FRG is left in a region in which the drain electrode DT (drain signal line DL) and the source electrode ST are to be formed.

In the same manner, in the formation region for the p-channel type thin film transistor PTFT, the photoresist film FRG is left as it is in a region in which the drain electrode DT (drain signal line DL) and the source electrode ST are to be formed. In this case, the photoresist film FRG is removed in a region on which the gate electrode GT of the p-channel type thin film transistor PTFT is formed and also in a region adjacent thereto.

Further, the second conductive layer CNL2 is etched using as a mask the photoresist film FRG having this pattern. In this case, the etching is performed such that the second conductive layer CNL2 is side-etched and an etched pattern of the second conductive layer CNL2 is subjected to reduction processing with respect to the photoresist film FRG.

In this case, the side etching performed on the second conductive layer CNL2 is performed within the range where, for example, in the p-channel type thin film transistor PTFT, each end face of the second conductive layer CNL2 formed by removal through the etching is located on the high concentration n-type impurity region (shown as $n^+$ in the figure) of the semiconductor layer PS in the contact hole TH.

Figure 6B:
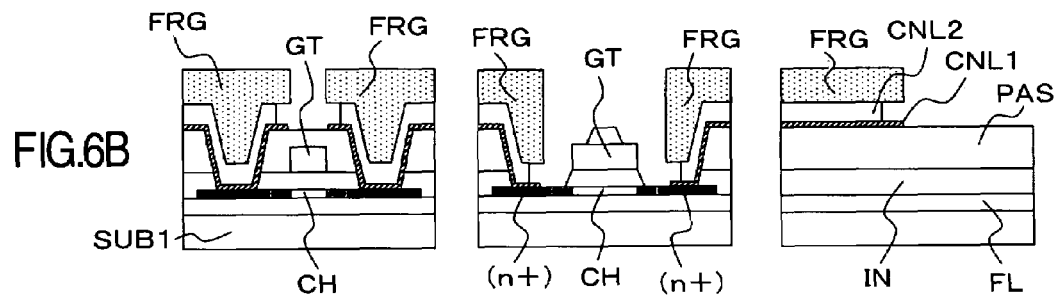

Next, as shown in FIG. 6B, the first conductive layer CNL1 is etched using the photoresist film FRG as a mask as it is. In this case, the first conductive layer CNL1 is etched without performing side etching thereon. AS a result, the etched first conductive layer CNL1 is formed as a pattern in which an outline of the layer CNL1 protrudes outward from that of the second conductive layer CNL2.

Thereafter, the photoresist film FRG is removed.

At this stage, the n-channel type thin film transistor NTFT is formed previous to the p-channel type thin film transistor PTFT.

Figure 6C:
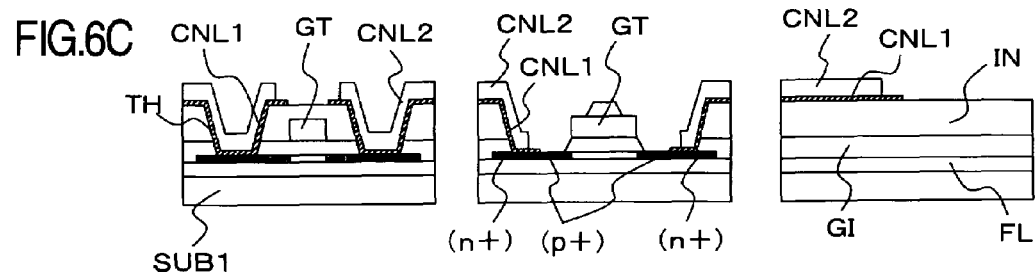

Next, as shown in FIG. 6C, p-type impurities such as boron ions are implanted into a surface of the substrate SUB1.

In this case, during this ion implantation, the formation region for the n-channel type thin film transistor NTFT is usually covered using the photoresist film as a mask. However, the mask is not required for the after-mentioned reason.

The ion implantation of this case is performed at a relatively low acceleration energy of about 20 keV. The reason is that the second conductive layer CNL2 is made to function as a mask during the ion implantation and the first conductive layer CNL1 is not made to function as a mask.

Thereby, in the semiconductor layer PS of the formation region for the p-channel type thin film transistor PTFT, the high concentration p-type impurity region (shown as $p^+$ in the figure) is formed in a region between the gate electrode GT and the second conductive layer CNL2. This high concentration p-type impurity region is formed in a lower layer of the first conductive layer CNL1 having an outline that is formed to protrude outward from an outline of the second conductive layer CNL2. Therefore, the high concentration p-type impurity region is constituted to be electrically connected to the first conductive layer CNL1. As a result, the p-channel type thin film transistor PTFT is formed.

On the other hand, in the formation region for the n-channel type thin film transistor NTFT, the formation region for the contact hole TH is completely covered with the second conductive layer CNL2. Therefore, boron ions are not implanted into the semiconductor layer PS and the n-channel type thin film transistor NTFT is formed as it is.

Figure 6D:
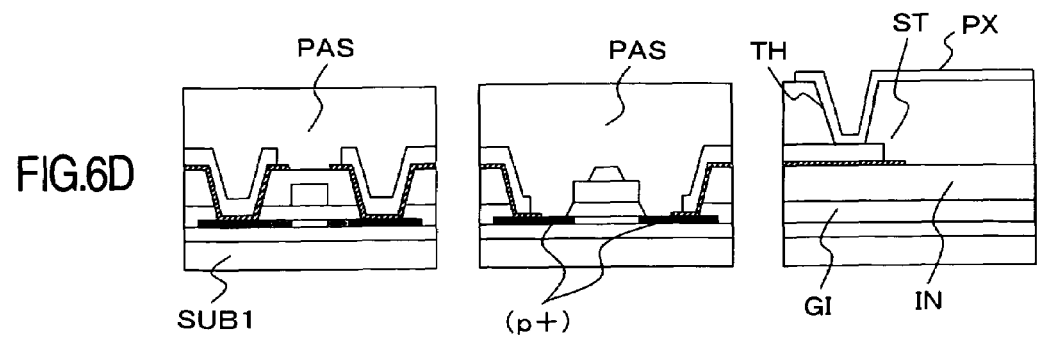

Thereafter, as shown in FIG. 6D, on a surface of the substrate SUB1, for example, resin is applied to form the protective coat PAS. Then, the contact hole TH is formed in the protective coat PAS and a portion of the source electrode ST of the n-channel type thin film transistor NTFT is exposed.

A transparent conductive layer made of, for example, an ITO film is formed to also cover the contact holes TH. The pixel electrode PX electrically connected to the source electrode ST is formed through the photo-etching steps.

In the manufacturing method of the thus constituted display device, reduction in the photolithographic process can be realized since the formation region for the n-channel type thin film transistor NTFT need not be covered with the mask made of a photoresist film in the step of FIG. 6C.

Second Embodiment

FIGS. 7A to 7D are step views of a modification example of the manufacturing method of the display device shown in the first embodiment.

Here, the display device shown in this embodiment has a portion structurally different from the display device shown in the first embodiment. Further, each of the gate electrodes GT of the n-channel type thin film transistor NTFT and the p-channel type thin film transistor PTFT is made of tungsten that is the same material as that of the first conductive layer.

FIGS. 7A to 7D are views corresponding to FIGS. 6A to 6D, respectively. Therefore, previous steps including a step of FIG. 7A are the same as those of FIGS. 5A to 5C and 6A to 6C.

As shown in FIG. 7A, the second conductive layer CNL2 is subjected to selective etching and the photoresist film FRG used as a mask during the etching is left as it is.

Further, as shown in FIG. 7B, the first conductive layer CNL1 is again etched using the photoresist film FRG as a mask. In this case, a side portion that intersects the semiconductor layer PS and that protrudes outward from the insulating layer IN is also etched in the gate electrode GT of the p-channel type thin film transistor PTFT. The reason is that any of the first conductive layer CNL1 and the gate electrode GT are formed of the same material made of tungsten. Therefore, the gate electrode is formed with a width being smaller than a previous width. As can be clearly understood from the following explanation, this reason is that this embodiment can exert an effect capable of reducing a channel length in the channel region CH of the p-channel type thin film transistor PTFT.

Thereafter, the photoresist film FRG is removed.

As shown in FIG. 7C, p-type impurities such as boron ions are implanted into a surface of the substrate SUB1.

In this case, during this ion implantation, the formation region for the n-channel type thin film transistor NTFT is usually covered using the photoresist film as a mask. However, in the same manner as in the first embodiment, the mask is not required for the after-mentioned reason.

The ion implantation of this case is performed at a relatively low acceleration energy of about 20 keV. The reason is that the second conductive layer CNL2 is made to function as a mask during the ion implantation and the first conductive layer CNL1 is not made to function as a mask.

Thereby, in the semiconductor layer PS of the formation region for the p-channel type thin film transistor PTFT, the high concentration p-type impurity region (shown as $p^+$ in the figure) is formed in a region between the gate electrode GT and the second conductive layer CNL2. This high concentration p-type impurity region is formed in a lower layer of the first conductive layer CNL1 having an outline that is formed to protrude outward from an outline of the second conductive layer CNL2. Therefore, the high concentration p-type impurity region is constituted to be electrically connected to the first conductive layer CNL1. As a result, the p-channel type thin film transistor PTFT is formed.

As described above, since a width of the gate electrode GT is formed to be relatively small, a distance between the respective high concentration p-type impurity regions is formed to be small. Therefore, this embodiment can exert an effect capable of reducing a width (channel width) in the channel region CH of the p-channel type thin film transistor PTFT.

Additionally, in the formation region for the n-channel type thin film transistor NTFT, the formation region for the contact hole TH is completely covered with the second conductive layer CNL2. Therefore, boron ions are not implanted into the semiconductor layer PS and the n-channel type thin film transistor NTFT is formed as it is.

Thereafter, as shown in FIG. 7D, on a surface of the substrate SUB1, for example, resin is applied to form the protective coat PAS. Then, the contact hole TH is formed in the protective coat PAS and a portion of the source electrode ST of the n-channel type thin film transistor NTFT is exposed.

The transparent conductive layer made of, for example, the ITO film is formed to also cover the contact hole TH. The pixel electrode PX electrically connected to the source electrode ST is formed through the photo-etching steps.

Third Embodiment

<Construction of Pixel>

Figure 8A:
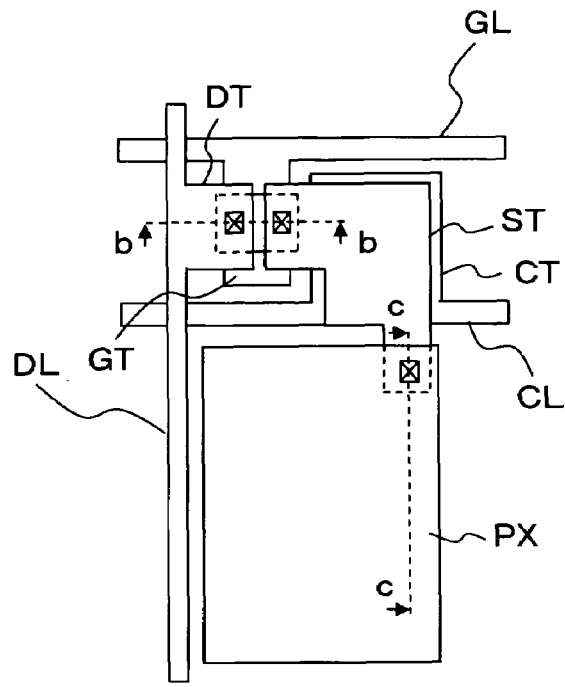
FIGS. 8A to 8C are block diagrams showing another embodiment of pixels of a display device to which a manufacturing method for a display device according to the present invention is applied.
Figure 8B:
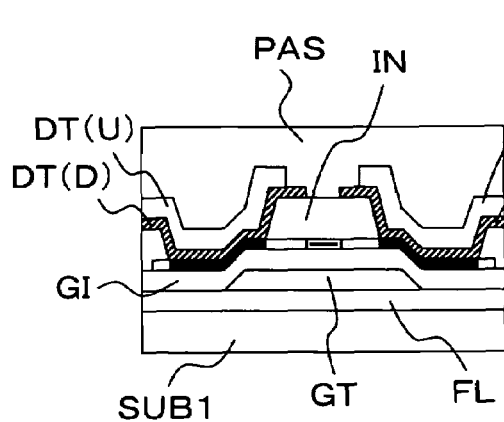
Figure 8C:
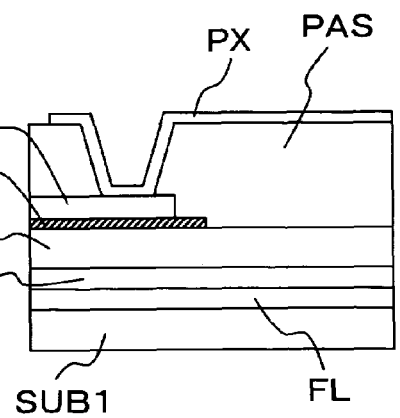

FIGS. 8A to 8C are views showing a construction of pixels of the display device to which another embodiment of the manufacturing method of the display device according to the present invention is applied and are views corresponding to FIGS. 3A to 3C.

FIG. 8A is a plan view, FIG. 8B is a cross-sectional view taken along line b-b of FIG. 8A, and FIG. 8C is a cross-sectional view taken along line c-c of FIG. 8A In this pixel, a different construction as compared with a case of the pixel shown in FIGS. 3A to 3C is as follows. That is, in the thin film transistor formed on the pixel, a so-called bottom gate type thin film transistor, in which the gate electrode is located on the lower layer of the semiconductor layer, is constituted.

Therefore, as shown in FIG. 8B, for example, in the formation region for the n-channel type thin film transistor NTFT, a structure in which the gate electrode GT, the insulating film (first insulating film) GI, the semiconductor layer PS, and the insulating film (second insulating film) IN are sequentially stacked is formed on a surface of the undercoat layer FL of the substrate SUB1.

Also in this case, in the same manner as shown in FIGS. 3A to 3C, the drain electrode DT is composed of a layered product of the lower drain electrode DT(D) and the upper drain electrode DT(U), and the lower drain electrode DT(D) is formed to protrude outward from the upper drain electrode DT(U). In the same manner, the source electrode ST is composed of a layered product of the lower source electrode ST(D) and the upper source electrode ST(U), and the lower source electrode ST(D) is formed to protrude outward from the upper source electrode ST(U).

Additionally, in a structure except for the above-described members, members indicated by the same symbols as those of FIGS. 3A to 3C have the same functions as those of members shown in FIGS. 3A to 3C.

<CMOS Thin Film Transistor>

Figure 9A:
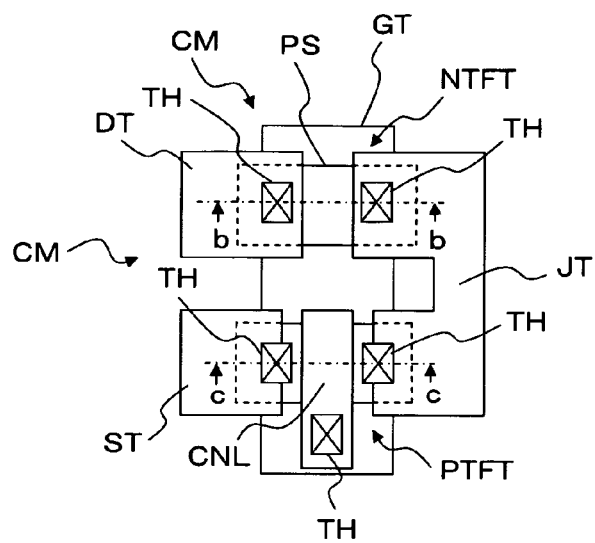
FIGS. 9A to 9C are block diagrams showing another embodiment of a CMOS transistor formed in the display device to which the manufacturing method for a display device according to the present invention is applied.

FIG. 9A is a plan view showing a CMOS thin film transistor CM in the inside of the scanning signal drive circuit V or the video signal drive circuit H that is formed along with the formation of the pixel shown in FIGS. 8A to 8C, and is a view corresponding to FIG. 1A.

Figure 9B:
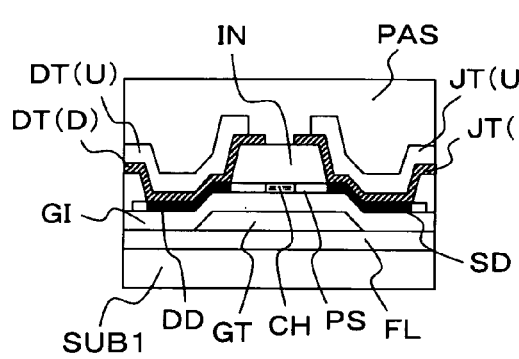
Figure 9C:
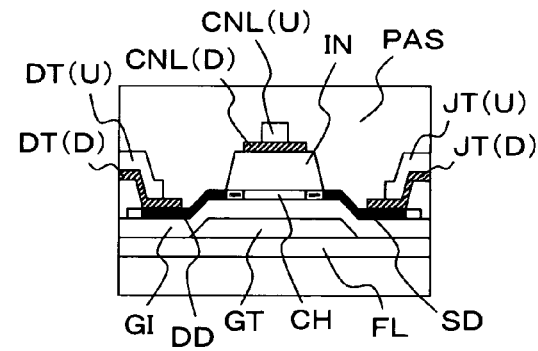

Further, FIG. 9B shows a cross-sectional view taken along line b-b of FIG. 9A, and FIG. 9C shows a cross-sectional view taken along line c-c of FIG. 9A.

In FIG. 9A, in the CMOS thin film transistor CM, the n-channel type thin film transistor NTFT and the p-channel type thin film transistor PTFT are arranged in parallel with each other, and the gate electrode GT of both the transistors is mutually formed in common.

The respective electrodes at the right side in the figure of the n-channel type thin film transistor NTFT and the p-channel type thin film transistor PTFT are connected with each other via the connection electrode JT.

For convenience' sake, in this specification, an electrode at the right side in the figure of the n-channel type thin film transistor NTFT constitutes the drain electrode DT, and an electrode at the right side in the figure of the p-channel type thin film transistor PTFT constitutes the source electrode ST.

Here, each of the gate electrodes GT of the n-channel type thin film transistor NTFT and the p-channel type thin film transistor PTFT is formed to be located on the bottom side of the semiconductor layer PS thereof. The reason is that the thin film transistor TFT formed on the pixel is formed as the bottom gate type thin film transistor and the CMOS thin film transistor CM is formed along with the formation of the pixel.

In this embodiment, in the formation region for the p-channel type thin film transistor PTFT, the conductive layer CNL is formed so as to intersect the semiconductor layer PS via the insulating film IN. To realize electric stabilization, this conductive layer CNL is connected to the gate electrode GT via the contact holes TH formed in the insulating films IN and GI.

As can be clearly understood from the following explanation on the manufacturing method of the display device, this conductive layer CNL is formed to make a contribution to reduction in the photolithographic process.

Further, the conductive layer CNL is composed of a layered product of the lower conductive layer CNL(D) and the upper conductive layer CNL(U), and the lower conductive layer CNL(D) is formed to protrude outward from the upper conductive layer CNL(U).

In the same manner as shown in FIGS. 1A to 1C, the drain electrode DT is composed of a layered product of the lower drain electrode DT(D) and the upper drain electrode DT(U), and the lower drain electrode DT(D) is formed to protrude outward from the upper drain electrode DT (U). In the same manner, the source electrode ST is composed of a layered product of the lower source electrode ST(D) and the upper source electrode ST(U), and the lower source electrode ST(D) is formed to protrude outward from the upper source electrode ST(U).

Additionally, in a structure except for the above-described members, members indicated by the same symbols as those of FIGS. 1A to 1C have the same functions as those of members shown in FIGS. 1A to 1C.

<Manufacturing Method>

FIGS. 10A to 10E and 11A to 11C are step views showing one embodiment of the manufacturing method of the liquid crystal display device.

In FIGS. 10A to 10E and 11A to 11C, cross-sectional views taken along line b-b of FIG. 9A (cross-sectional views taken along line b-b of FIG. 8A) are shown at the left side of the figure, cross-sectional views taken along line c-c of FIG. 9A are shown at the center of the figure, and cross-sectional views taken along line c-c of FIG. 8A are shown at the right side of the figure. That is, a portion of the n-channel type thin film transistor NTFT is shown at the left side of the figure, a portion of the p-channel type thin film transistor PTFT is shown at the center of the figure, and a portion of the pixel electrode PX is shown at the right side of the figure. Hereinafter, a description will be made in the order of steps.

First, as shown in FIG. 10A, on the liquid-crystal-side surface of the substrate SUB1, the undercoat layer FL made of silicon dioxide film is formed to a thickness of about 300 nm. Then, an aluminum film formed on a surface of the undercoat layer FL is patterned by the photoetching process to form the gate electrode GT. Next, the insulating film (first insulating film) GI made of silicon dioxide film is formed to a thickness of about 100 nm by, for example, the plasma CVD method.

Subsequently, an amorphous silicon layer is formed to a thickness of about 50 nm by, for example, the plasma CVD method. Then, the amorphous silicon layer is crystallized with irradiation of XeCl excimer laser. Then, the crystallized silicon layer is patterned by the photoetching process to form the semiconductor layer PS made of a polysilicon layer into an island pattern.

Further, a low concentration of phosphorus ions are implanted into a surface of the substrate SUB1 and the semiconductor layer PS is formed as the low concentration n-type impurity region (shown as n⁻ in the figure). The reason is that a threshold of the semiconductor layer PS is adjusted.

Next, as shown in FIG. 10B, the insulating film (second insulating film) IN made of, for example, silicon nitride film is formed to a thickness of about 300 nm. In each of the formation regions for the thin film transistors, the each of the contact holes TH for connecting the source/drain electrodes is formed and a portion of the semiconductor layer PS is exposed.

A high concentration of phosphorus ions are implanted into a surface of the substrate SUB1 and the high concentration n-type impurity region (shown as n⁺ in the figure) is formed in the semiconductor layer PS exposed by the contact holes TH.

Next, as shown in FIG. 10C, on a surface of the substrate SUB1, the first conductive layer CNL1 made of tungsten having, for example, a thickness of 30 nm and the second conductive layer CNL2 made of aluminum having, for example, a thickness of 500 nm are sequentially formed to also cover the contact holes TH.

Next, as shown in FIG. 10D, the photoresist film FRG is formed on the entire region of a surface of the second conductive layer CNL2, and this photoresist film FRG is patterned using photolithography techniques.

That is, in the formation region for the n-channel type thin film transistor NTFT, the photoresist film FRG is left in a region in which the drain electrode and the source electrode are to be formed. Here, the drain electrode DT and the source electrode ST are formed to cover the entire contact hole TH formed in the insulating film IN, respectively.

Therefore, the photoresist film FRG that is left on the source electrode and the photoresist film FRG that is left on the drain electrode are separated and formed above the gate electrode GT of the n-channel type thin film transistor NTFT. In a plan view manner, each sidewall surface of the photoresist film FRG formed due to the separation is formed to be located on the side slightly inner than a corresponding sidewall surface of the insulating film IN above the gate electrode GT.

On the other hand, in the formation region for the p-channel type thin film transistor PTFT, the photoresist film FRG is left in a region in which the drain electrode and the source electrode are to be formed. Here, in the formation region for the contact hole TH formed in the insulating film IN, the drain electrode and the source electrode are respectively formed so as to cover about half of a region facing the gate electrode GT.

Further, the photoresist film FRG is left also above the insulating film IN above the gate electrode GT, and sidewall surfaces on the source electrode and drain electrode sides of the film FRG are formed to be located on the side slightly inner than corresponding sidewall surfaces of the insulating film IN.

Then, using as a mask the photoresist film FRG consisting of such a pattern, the second conductive layer CNL2 is etched. In this case, the second conductive layer CNL2 is side-etched and an etched pattern of the second conductive layer CNL2 is subjected to reduction processing with respect to the photoresist film FRG.

In this case, the side etching performed on the second conductive layer CNL2 is performed within the range where, for example, in the p-channel type thin film transistor PTFT, each end face of the second conductive layer CNL2 formed by removal through the etching is located on the high concentration n-type impurity region (shown as n⁺ in the figure) of the semiconductor layer PS in the contact holes TH.

Next, the photoresist film FRG is left as it is and as shown in FIG. 10E, using the photoresist film FRG as a mask, the first conductive layer CNL1 is etched to remove the photoresist film FRG.

Thereby, the first conductive layer CNL1 in the n-channel type thin film transistor NTFT is separated and formed on a surface of the insulating film IN above the gate electrode GT. The layer CNL1 is formed to run on to the surface of the insulating film IN from each of the contact hole TH sides.

On the other hand, the first conductive layer CNL1 in the p-channel type thin film transistor PTFT is formed mainly on a surface of the insulating film IN above the gate electrode GT. The layer CNL1 is formed to be reduced on the side slightly inner than the sidewall surface of the insulating film IN, formed by each of the contact holes TH.

Additionally, in a surface of the semiconductor layer PS exposed by the contact hole TH, the first conductive layer CNL1 formed as the source/drain electrodes is formed to cover about half of a region facing the gate electrode GT; the above-described matter is the same manner as in the first embodiment.

Figure 11A:
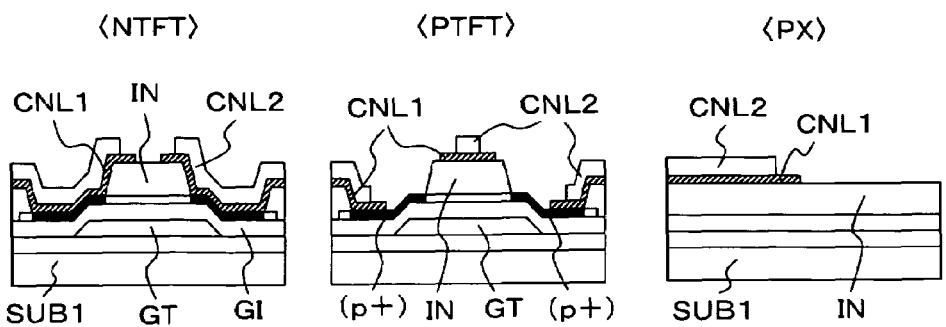
FIGS. 11A to 11C are step views showing another embodiment of the manufacturing method for a display device according to the present invention.

As shown in FIG. 11A, p-type impurities such as boron ions are implanted into a surface of the substrate SUB1.

In this case, during the ion implantation, the formation region for the n-channel type thin film transistor NTFT is usually covered using the photoresist film as a mask; however, the mask is not required for the after-mentioned reason.

The ion implantation of this case is performed at a relatively low acceleration energy of about 20 keV. The reason is that the second conductive layer CNL2 is made to function as a mask during the ion implantation and the first conductive layer CNL1 is not made to function as a mask.

Thereby, in the semiconductor layer PS of the formation region for the p-channel type thin film transistor PTFT, the high concentration p-type impurity region (shown as p⁺ in the figure) is formed in a region between the gate electrode GT and the second conductive layer CNL2. This high concentration p-type impurity region is formed in a lower layer of the first conductive layer CNL1 having an outline that is formed to protrude outward from an outline of the second conductive layer CNL2. Therefore, the high concentration p-type impurity region is constituted to be electrically connected to the first conductive layer CNL1. As a result, the p-channel type thin film transistor PTFT is formed.

On the other hand, in the formation region for the n-channel type thin film transistor NTFT, the formation region for the contact hole TH is completely covered with the second conductive layer CNL2. Therefore, boron ions are not implanted into the semiconductor layer PS and a state in a previous step is kept.

Figure 11B:
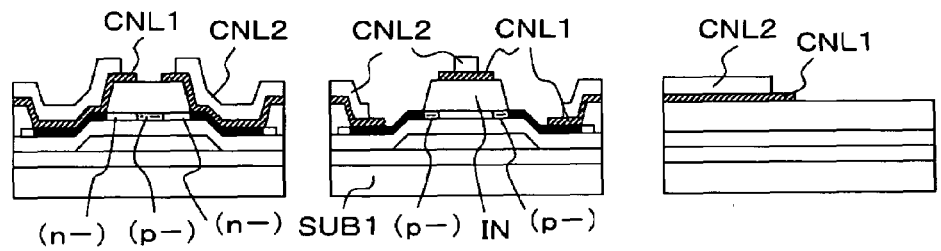

As shown in FIG. 11B, a low concentration of boron ions are implanted into a surface of the substrate SUB1 at the high acceleration energy of about 90 keV.

Thereby, in the formation region for the n-channel type thin film transistor NTFT, the boron ions are passed through the insulating film IN and implanted into the semiconductor layer PS to form a low-concentration p-type channel layer (shown as p⁻ in the figure). The reason is that a threshold of the n-channel type thin film transistor NTFT is adjusted.

In this case, the first conductive layer CNL1 formed on a surface of the insulating film IN serves as a mask during the ion implantation. Accordingly, the low concentration n-type channel region (shown as n⁻ in the figure) that has been heretofore formed is left in the semiconductor layer PS below the first conductive layer CNL1.

On the other hand, in the formation region for the p-channel type thin film transistor PTFT, since the first conductive layer CNL1 is formed on a surface of the insulating film IN, boron ions are not implanted into the semiconductor layer PS below the first conductive layer CNL1. The low concentration n-type channel region in which a threshold is already set is left as it is, and the low concentration p-type channel region (shown as p⁻ in the figure) is formed between the low concentration n-type channel region and each of the high concentration p-type impurity regions and no more. The reason is that the first conductive layer is not formed above the low concentration p-type channel region.

Figure 11C:
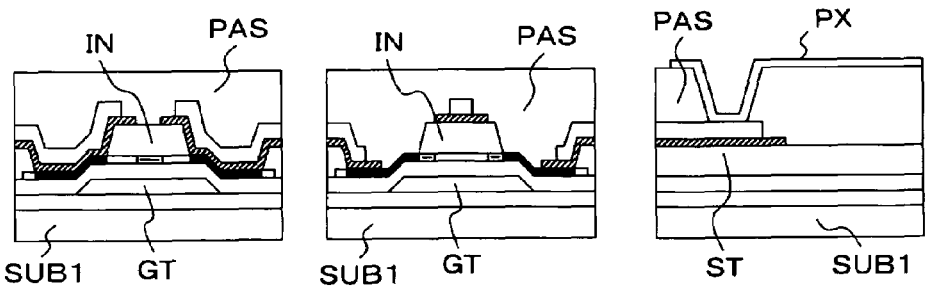

As shown in FIG. 11C, on a surface of the substrate SUB1, for example, resin is applied to form the protective coat PAS. Then, the contact hole TH is formed in the protective coat PAS and a portion of the source electrode ST of the thin film transistor is exposed.

The transparent conductive layer made of, for example, the ITO film is formed to also cover the contact hole TH. The pixel electrode PX electrically connected to the source electrode ST is formed through the photo-etching steps.

Other Embodiments

In each of the above-described embodiments, for example, glass material is used as the substrate SUB1. However, the substrate SUB1 is not limited thereto, and an insulating material such as silica glass or plastics may be used. When silica glass is used, a process temperature can be set to a high temperature and a so-called gate insulating film (insulating film GI) can be fined. When plastics is used, a light substrate excellent in shock resistance can be formed. Further, the undercoat layer FL formed on a surface of the substrate SUB1 is not limited to a silicon dioxide film, and may be formed using a silicon nitride film or a film stack made of a silicon dioxide film and a silicon nitride film.

A crystallization method of amorphous silicon during the formation of a polysilicon layer is not limited to the above-described method and, for example, a solid-state growth method using a thermal annealing process may be used. Additionally, the thermal annealing process and a laser annealing process may be combined. By thus using the thermal annealing process, flatness of a polysilicon layer can be improved.

In each of the above-described embodiments, a polysilicon layer is used as the semiconductor layer and further, an amorphous silicon layer or microcrystalline silicon layer may be used. Further, a polysilicon layer formed directly using a catalytic chemical vapor phase growth method or reactive thermal CVD method may be used. Additionally, an oxide semiconductor layer may be used.

In each of the above-described embodiments, tungsten is used as the lower conductive layer CNL1; however, the layer CNL1 is not limited thereto. Any metal of Ti, TiW, TiN, Cr, Mo, MoW, Ta and Nb, or an alloy thereof may be used.

In each of the above-described embodiments, ITO (Indium Tin Oxide) is used as the pixel electrode PX; however, it is not limited thereto. The pixel electrode PX may be formed using a transparent conductive layer of, for example, ZnO-type.

In each of the above-described embodiments, as one embodiment of the display device, a liquid crystal display device is quoted as an example. Further, it is needless to say that the present invention can be applied also to the display device using, for example, OLED (Organic Light Emitting Diode).

The above-described embodiments may be used independently or in combination so that the advantages of the respective embodiments can be achieved independently or in combination.

The invention claimed is:

1. A manufacturing method for a display device including a substrate having formed thereon a first conductive type thin film transistor and a second conductive type thin film transistor, the method comprising the steps of:
    preparing a substrate having respective formation regions for a first conductive type thin film transistor and a second conductive type thin film transistor, in which a semiconductor layer, a first insulating film covering the semiconductor layer, and a gate electrode disposed on the first insulating film so as to intersect the semiconductor layer are formed and first conductive type impurity regions are formed on both outer sides of a channel region of the semiconductor layer below the gate electrode;
    forming a second insulating film on the substrate so as to also cover the gate electrode, and forming in the second insulating film and the first insulating film a contact hole used for connection between a drain electrode and a source electrode, the contact hole being formed so as not to expose the gate electrode in the formation region for the first conductive type thin film transistor and so as to partially expose each side of the gate electrode intersecting the semiconductor layer in the formation region for the second conductive type thin film transistor;
    forming the drain electrode and the source electrode using a multilayer conductive layer including an upper conductive layer and a lower conductive layer an outline of which protrudes outward from that of the upper conductive layer, the drain electrode and the source electrode being formed so as to cover each of the contact holes in the formation region for the first conductive type thin film transistor and so as to cover a portion of each of the contact holes facing the gate electrode in the formation region for the second conductive type thin film transistor;
    and forming by doping second conductive type impurities a second conductive type impurity region in the semiconductor layer having a portion having formed thereon none of the electrodes and having a portion having formed thereon only the lower conductive layer in each of the contact holes in the formation region for the second conductive type thin film transistor.

2. The manufacturing method for a display device according to claim 1, wherein
    the semiconductor layer is made of polysilicon.

3. The manufacturing method for a display device according to claim 1, wherein
    the first conductive type impurity regions formed on both outer sides of a channel region of the semiconductor layer below the gate electrode include low concentration first conductive type impurity regions formed on both outer sides of the channel region and high concentration first conductive type impurity regions formed on an outer side of the respective low concentration first conductive type impurity regions.

4. The manufacturing method for a display device according to claim 1, wherein
    each of the drain electrode and the source electrode is formed by etching using as a mask a photoresist film formed on a surface of a layered product including the lower conductive layer and the upper conductive layer, and the upper conductive layer is etched larger than the lower conductive layer by side etching with respect to the mask.

5. The manufacturing method for a display device according to claim 1, wherein the gate electrode and the lower conductive layer are made of the same material.

6. The manufacturing method for a display device according to claim 5, wherein the gate electrode and the lower conductive layer are made of tungsten or a tungsten alloy.

7. The manufacturing method for a display device according to claim 1, wherein:

a plurality of pixels are formed on the substrate, and each of the pixels has a thin film transistor turned-on by scanning signals from a gate signal line and a pixel electrode to which video signals from a drain signal line are supplied via the turned-on thin film transistor, the thin film transistor being one thin film transistor of the first conductive type thin film transistor and the second conductive type thin film transistor.

8. The manufacturing method for a display device according to claim 7, wherein:

a scanning signal drive circuit that supplies scanning signals to each of the gate signal lines and a video signal drive circuit that supplies video signals to each of the drain signal lines are formed on the substrate; and the scanning signal drive circuit and the video signal drive circuit have the first conductive type thin film transistor and the second conductive type thin film transistor.

* * * * *